(12) United States Patent
Humbert et al.

(10) Patent No.: US 7,307,341 B2
(45) Date of Patent: Dec. 11, 2007

(54) INTEGRATED PACKAGED HAVING MAGNETIC COMPONENTS

(75) Inventors: Donald Humbert, Santa Clara, CA (US); Courtney R. Furnival, Lake Arrowhead, CA (US)

(73) Assignee: IXYS Corporation, Santa Clara, CA (US)

( * ) Notice: Subject to any disclaimer, the term of this patent is extended or adjusted under 35 U.S.C. 154(b) by 141 days.

(21) Appl. No.: 11/329,934

(22) Filed: Jan. 10, 2006

(65) Prior Publication Data
US 2006/0152911 A1 Jul. 13, 2006

Related U.S. Application Data

(60) Provisional application No. 60/642,890, filed on Jan. 10, 2005.

(51) Int. Cl.
*H01L 23/34* (2006.01)
(52) U.S. Cl. ............... 257/728; 257/678; 257/684; 257/690; 257/693; 257/723
(58) Field of Classification Search ............... 257/98, 257/99, 100, 678, 684, 690, 693, 723, 728
See application file for complete search history.

(56) References Cited

U.S. PATENT DOCUMENTS

| | | | |
|---|---|---|---|
| 5,469,334 A | 11/1995 | Balakrishnan | |
| 5,835,367 A | 11/1998 | Pan et al. | |
| 6,797,891 B1 | 9/2004 | Blair et al. | |
| 7,135,728 B2 * | 11/2006 | Duan et al. | 257/296 |
| 2003/0042571 A1 | 3/2003 | Chen et al. | |
| 2007/0121364 A1 * | 5/2007 | Bertin et al. | 365/129 |

* cited by examiner

*Primary Examiner*—Fernando L. Toledo
(74) *Attorney, Agent, or Firm*—Townsend & Townsend & Crew LLP

(57) ABSTRACT

A packaged device is obtained using an innovative package approach that allows integration of miniature planar magnetics into standard low-cost semiconductor packages (BGA, PDIP, SOIC, etc.) with electronic and electrical components, where those components can be C&W and/or SMD types. The packaged device includes a planar magnetic substrate having first and second dielectric layers, the first dielectric layer having a first winding defined thereon, the second dielectric layer having a second winding defined thereon. A magnetic component is provided in the substrate. A package material provided at least partly around the substrate and the magnetic component to protect the substrate and magnetic component. The magnetic component is an inductor or transformer. The packaged device further includes at least one semiconductor component provided on the first dielectric layer.

22 Claims, 6 Drawing Sheets

INTEGRATED PACKAGED HAVING MAGNETIC COMPONENTS

CROSS-REFERENCES TO RELATED APPLICATIONS

The present application claims priority to U.S. Provisional Patent Application No. 60/642,890, filed on Jan. 10, 2005, which is incorporated by reference.

BACKGROUND OF THE INVENTION

The present invention relates to a packaged device that integrates one or more magnetic components into standard semiconductor package technologies. The packed device may include one or more magnetic components only, or one or more magnetic components plus one or more electrical or electronic components, e.g., a semiconductor chip, resistor, or capacitor.

Semiconductor power devices of various types are used in electronic and electrical parts to operate them. For example, power MOSFETs or IGBTs are used to supply power to electronic or electrical parts. These power MOSFETs and IGBTs, in turn, are commonly driven by gate drivers that are coupled to the gates of the power MOSFETs and IGBTs.

The potential difference between the input side and the outside is generally 3-20 volts. However, the required voltage isolation capacity tends to be very large in certain applications, e.g., 3750 volts or more, to protect against sudden spikes or fault conditions. Accordingly, the input side and the output side are isolated from each other using various different techniques. One method is to use a transformer as an interface between the input and output sides. Such a transformer requires one or more magnetic components and windings that are generally bulky. Accordingly, the transformer is placed external to the packaged gate driver, which requires a large footprint and increased manufacturing cost. Another technique is to integrate an optocoupler within a packaged gate driver. Such a device, which uses optical coupling, does not provide as good a performance as one based on magnetic coupling.

BRIEF SUMMARY OF THE INVENTION

The present invention relates to packaged devices having integrated magnetic components. Embodiments of the invention relate to providing a planar magnetic component within a packaged device using standard semiconductor package technologies. Such a device may be used with AC-DC converters, DC-DC converters, gate drivers, and other electronic and electrical devices.

In one embodiment, miniature magnetic components are integrated into standard semiconductor packages with other active and passive devices. A substrate whereon one or more semiconductor chips are provided integrates planar-embedded winding arrangements. The planar magnetic components are magnetic components with a low profile, e.g., the windings are substantially two-dimensional or planar layers. The integration allows miniature magnetic I-bar and U-core components to be provided within the package. This magnetic assembly (including the I-bar, U-core, and windings) defines a transformer that provides magnetically isolated and coupled products within standard and custom semiconductor packages. These packages include Plastic Dual In-Line Package (PDIP), Small Outline Integrated Circuit (SOIC) and Ball Grid Array (BGA) packages, but the approach is not limited to these packages. The package is well suited for molded plastic packages that allow low cost automated assembly, but may be used for other packages.

Another embodiment relates to a substrate for magnetics. For example, Printed Circuit Board (PCB) provides a carrier and windings for transformers and inductors within standard and custom semiconductor packages. That is, the PCB is integrated into the standard package types. This includes PCBs that are compatible with standard assembly processes like Chip and Wire (C&W) and Surface Mounted Devices (SMD), and associated processes like soldering, molding, trimming, and all other standard processes.

The substrate is sufficiently small to be provided within a package, configured to take a high temperature, designed to accommodate Standard Surface Mount (SMD) and Chip & Wire assembly and support the magnetic cores. In one embodiment, the PCB substrate uses a high glass-transition temperature (Tg) multi-function resin board that could be used in high temperature operations, such as, soldering and molding. In other implementations, the substrate may use BT Resin, Polyimid, or other materials.

The substrate can be dropped into and soldered or epoxied to a custom leadframe for a standard molded package. The leadframe paddles and tabs can provide support and alignment, as in the 8L-PDIP example. The substrate can be pre-assembled as in the 8L-PDIP examples, or post-assembled.

In the case of pre-assembled substrates, the assembly can occur in a snapstrate, which can be singulated after component assembly, wire bonding, and other substrate operations. The 8L-PDIP Snapstrate is an example of this technique, which provides lower assembly costs.

Yet another embodiment relates to a BGA package with a groove and holes for magnetic components. For example, a grooved PCB panel, which is milled or routed prior to singulation into substrate array, is provided. This makes the grooves more economical, and controllable. The groove is configured to receive the I-bar and bonded thereto, thereby providing a flat package bottom that is suitable for standard BGA package assembly. The groove may be configured to receive other magnetic components in other applications. For example, the groove may be implemented to receive a plate in an application for DC-DC converters.

The holes are drilled into the PCB and at least partly into the groove to place the U-core in place against the I-bar until the U-core glue is cured. The I-bar and U-core are glued into place on the BGA substrate in the present embodiment, but the technology may be applied to other holding techniques, and may include press fit, clamp or other suitable holding techniques. In other applications, magnetic components other than the U-core, e.g., an E-core or four-post table, may be used.

The BGA provides a lower profile package and smaller footprint size. In the case of isolated input/output products, a first set of balls associated with an input die and a second set of balls associated with an output die are placed on the opposite ends of the package to provide a large creepage path for the required voltage isolation. Each of the first and second set of balls may include one or more rows of balls according to application. In the case of DC-DC Converter, and other isolated products that dissipate significant power, the BGA configuration provides excellent power dissipation or low thermal resistance, while maintaining a large creepage distance for voltage isolation.

In yet another embodiment, a packaged device includes a substrate having first and second dielectric layers, the first dielectric layer having a first winding defined thereon, the second dielectric layer having a second winding defined thereon. A magnetic assembly is formed on the substrate. An input die provided on the first dielectric layer is configured to receive a first signal and transmit a second signal to the magnetic assembly. An output die provided on the first dielectric layer is configured to receive the second signal via the magnetic assembly and output a third signal to an external node. A package material is provided over the magnetic assembly, the input die, and the output die to protect the magnetic assembly, the input die, and the output die from physical and environmental damage.

The magnetic assembly is a transformer and facilitates in isolating the input and output functions, so that the components (e.g., the die, wiring, and pins) on the input side are isolated from those on the output side. The magnetic assembly includes a U-core and an I-bar. The substrate includes a third dielectric layer having a groove to receive the I-bar, wherein the third dielectric layer is a lower dielectric layer and the first dielectric layer is an upper dielectric layer.

The device also includes a plurality of first balls associated with the input die and secured to the third dielectric layer of the substrate; and a plurality of second balls associated with the output die and secured to the third dielectric layer of the substrate, wherein the first balls and the second balls are placed on the opposite ends of the substrate. The first balls are arranged in a single row. Alternatively, the first balls are arranged in at least two rows.

The device is configured to satisfy the voltage isolation requirement of at least 3750 volts between the input and output leads. The power device has a height of no more than 0.15 inch, a width of no more than 0.3 inch, and a length of no more than 0.5 inch. Alternatively, the power device has a height of about 0.11 inch, a width of about 0.22 inch, and a length about 0.42 inch. In yet another implementation, the power device has a height of no more than 0.2 inch, a width of no more than 0.5 inch, and a length of no more than 1 inch.

In yet another embodiment, a packaged device includes a planar magnetic substrate having first and second dielectric layers, the first dielectric layer having a first winding defined thereon, the second dielectric layer having a second winding defined thereon. A magnetic component is provided in the substrate using a semiconductor packaging technology. A package material provided at least partly around the substrate and the magnetic component to protect the substrate and magnetic component. The magnetic component is an inductor or transformer. The packaged device further includes at least one electronic component provided on the first dielectric layer. Alternatively or additionally, at least one electrical component is provided on the first dielectric layer. The electrical component is a resistor or capacitor. The electronic and electrical components may be C & W and/or SMD. The substrate and the magnetic component are configure to accommodate an automatic pack and place process

DETAILED DESCRIPTION OF THE INVENTION

The present invention relates to a packaged device having one or more magnetic components. The packaged device may include one or more semiconductor or electrical components, e.g., die, resistor, and capacitor. The packaged device may be a power device (e.g., DC-DC converter), electronic device (e.g., gate driver), or electrical device (e.g., transformer or inductor). The magnetic components or ferrites are integrated into the packaged device using standard semiconductor package technologies. The magnetic component(s) may define a transformer or inductor according to application.

The packaged device is an isolated gate driver according to one embodiment of the present invention. The packaged power device includes various types of packaged devices, e.g., a ball grid array (BGA) and a plastic dual in-line package (PDIP). The present invention may be applied to many different types of devices, e.g., a gate driver, a DC-DC converter, and a power amplifier. These devices may be isolated or non-isolated devices. For illustrative convenience, the present invention is described herein primarily with its application to an isolated gate driver in a BGA package. As will be understood by those skilled in the art, the present invention may also be applied to other types of devices and packages.

Figure 1A:
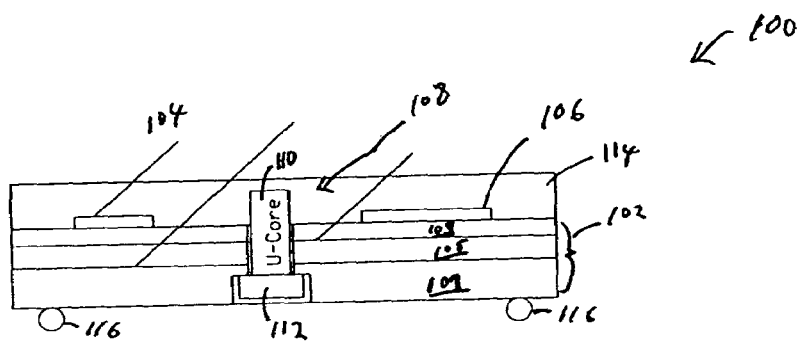
FIG. 1A illustrates a cross-sectional view of a packaged device according to one embodiment of the present invention.

FIG. 1A illustrates a cross-sectional view of a packaged device 100 according to one embodiment of the present invention. The device 100 is an isolated gate driver in the present embodiment. The gate driver 100 includes a substrate 102 having a plurality of dielectric layers, an input die 104 to receive input signals or voltage, and an output die 106 to output control signals or voltage to drive a power transistor (not shown) to which the gate driver is coupled. The power transistor may be a power MOSFET or IGBT. The gate driver 100 further includes a magnetic assembly 108 including a U-core 110 and an I-bar 112. A package material (or epoxy resin) 114 is formed over the dice 104 and 106 and the magnetic assembly 108 to protect these and other components formed on the substrate 102. A plurality of solder balls 116 are placed on the bottom of the substrate 102 to receive and output signals. As used herein, the term "on" refers to a situation where a first object is "above and in direct contact" with a second object as well as where the first object is "above but not in direct contact" with the second object. In the present embodiment, the magnetic assembly 108 defines a transformer that is used to transfer signals from the input die to the output die while isolating the input and output dice 104 and 106.

The substrate 102 includes a first dielectric layer 103 has an input winding defined thereon to be coupled to the input side (or the input die 104). A second dielectric layer 105 has an output winding defined thereon to be coupled to the output side (the output die 106). The windings are defined on the second and third dielectric layers and are not physically wound around the posts of the U-core. The substrate 102, accordingly, is a planar magnetic substrate. The input and output windings may be defined on different dielectric layers according to implementations. A third dielectric layer 107 that has a groove (see FIG. IC) to receive the I-bar therein. The groove extends along a lateral direction at the middle of the substrate. In the present implementation, the substrate is made of a PCB having high glass transition temperature (Tg).

In addition to the dielectric layers, the substrate 102 includes a plurality of conductive layers. A first conductive layer including the component pads and winding is provided on an upper side of the first dielectric layer. A second conductive layer including windings and interconnects is provided on an upper side of the second dielectric layer. A third conductive layer including windings and interconnects is provided on an upper side of the third dielectric layers. A fourth conductive layer including solder ball pads are provided on a lower side of the third dielectric layer.

Figure 1B:
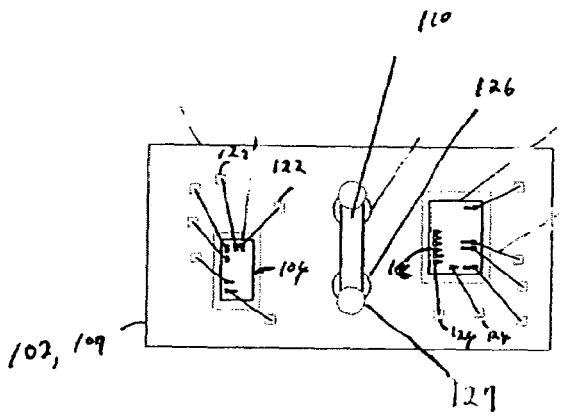
FIG. 1B illustrates a top view of the gate driver according to one embodiment of the present invention.

FIG. 1B illustrates a top view of the gate driver 100 according to one embodiment of the present invention. The package material 114 and winding are not shown. The input die 104 is wired bonded to a plurality of input pads 122 to receive input signals and power. The output die 106 is wired bonded to a plurality of output pads 124 to send output signals and receive power. The substrate 102 defines two holes 126 to receive the two posts of the U-core 110. The holes have the diameter of about 0.40 inch and a pitch of about 0.86 inch. The ends of the U-core are provided with adhesive 127 to secure the U-core in place. The posts connects to the I-bar 112 provided below the U-core. The U-core, I-bar, and windings together define a transformer that is used to transfer signals from the input die to the output die while keeping these two dice isolated from their respective voltage sources. The magnetic components other than U-core and/or I-bar may be used in other embodiments, e.g., where the packaged device is not a gate driver.

Figure 1C:
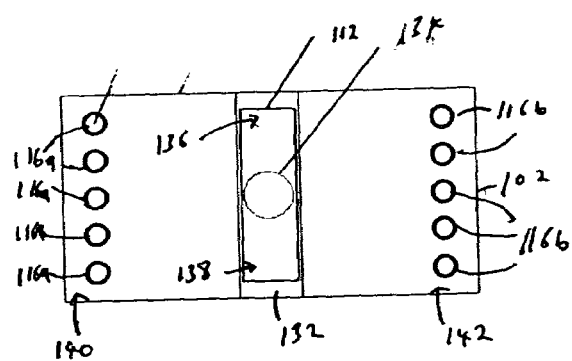
FIG. 1C illustrates a bottom view of the gate driver according to one embodiment of the present invention.

FIG. 1C illustrates a bottom view of the gate driver 100 according to one embodiment of the present invention. A groove 132 is formed on the bottom of the substrate 102. The I-bar 112 is provided within the groove, so that the bottom surface can be substantially planar without any protruding portion. If the entire bottom surface of the substrate is not substantially planar, the balls formed thereon may not form a good contact with external signal/power nodes.

Accordingly, the groove is formed to have a depth that is slightly deeper than the height of the I-bar since other materials are inserted in the groove. The I-bar is attached to the substrate 102 within the groove 132 by providing adhesive 134 on the groove. The adhesive is provided on the middle of the groove, so that only the middle part of the I-bar is bonded to the substrate 102 and leaving the ends of 136 and 138 of the I-bar free. Not bonding the ends 136 and 138 of the I-bar to the substrate prevent the I-bar from cracking when the epoxy resin is cured. The epoxy resin shrinks slightly more than the substrate 102 during the curing step. As a result, if the ends of the I-bar are bonded to the substrate, the I-bar may crack as a result of the difference in shrinkage ratio between the epoxy resin and the substrate. The solder balls 116 are arranged on the ends of the substrate 102. The balls 116a associated with the input die (or input signals) are provided on the a first end 140 of the substrate. The balls 116b associated with the output die (or output signals) are provided on a second end 142. That is, the first set of balls 116a and the second set of balls 116b are arranged to be at opposing ends of the substrate to provide a larger creepage path to increase the voltage isolation capacity of the gate driver 100. In one implementation, the gate driver 100 is configured to satisfy the isolation capacity of 3750 volts.

Figure 2A:
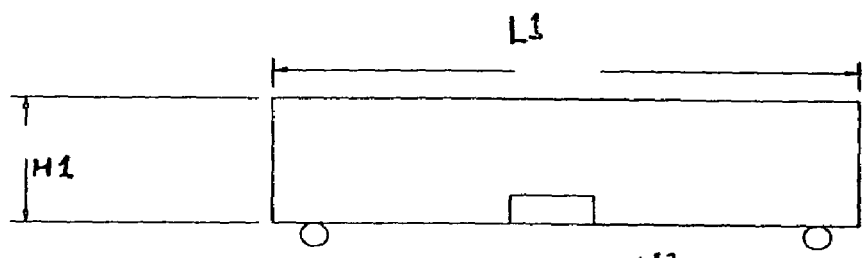
FIGS. 2A and 2B illustrate the dimensions of the gate driver according to one embodiment of the present invention.
Figure 2B:
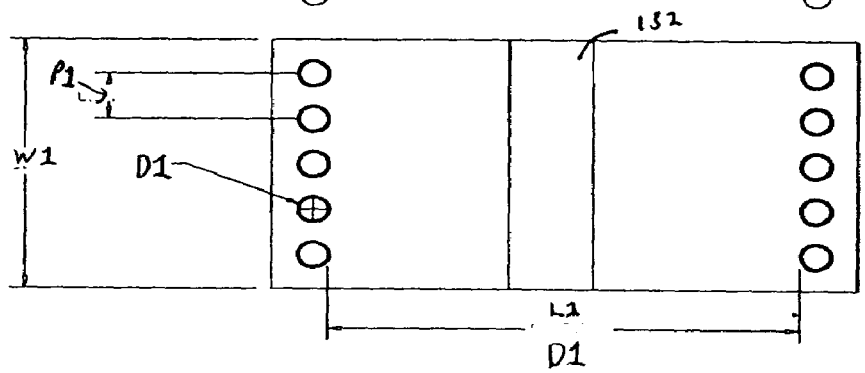

FIGS. 2A and 2B illustrate the dimensions of the gate driver 100 according to one embodiment of the present invention. The isolated gate driver 100 is configured to have a height H1 of about 0.11 inch, a length L1 of about 0.42 inch, and a width W1 of about 0.22 inch. The first set of balls 116a and the second set of balls 116b are separated by a distance D1 (or creepage path) of about 0.338 inch to provide voltage isolation of at least 3750 volts. The balls are separated from each other to have a pitch of about 0.04 inch. The diameter of the ball is about 0.02 inch.

Figure 3:
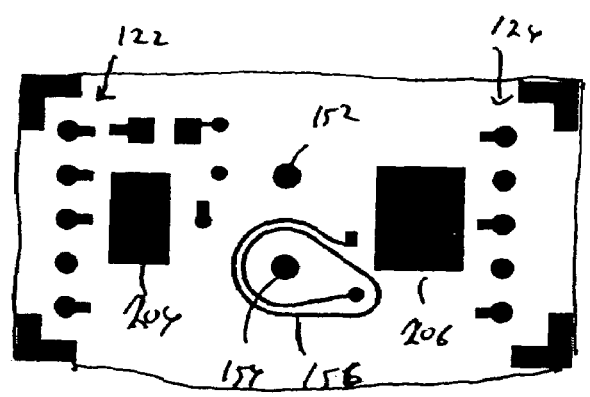
FIG. 3 illustrates a top-view of component pads provided on the third dielectric layer of the substrate of the gate driver.

FIG. 3 illustrates a top view of a first conductive layer of the substrate (i.e., components pads and winding) provided on the first dielectric layer 103 of the substrate 102 of the gate driver 100. Pads 204 and 206 for the input and output dice 104 and 106 are provided on the opposing ends. First and second circles 152 and 154 in the middle correspond to the holes 126 in FIG. 2B that are configured to receive the posts of the U-core. The circles are not actual part of the first conductive layer and are provided merely for illustrative purposes. An output winding 156 is defined to "wrap" the post to be inserted into the circle 154. A similar input winding (not shown) is defined on the second conductive layer of the substrate for the post to be inserted into the circle 152. The input pads 122 and the output pads 124 are placed on the opposite ends of the substrate in the present implementation.

Figure 4:
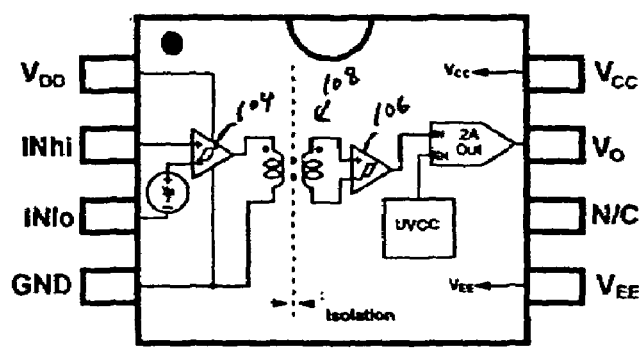
FIG. 4 illustrates a circuit corresponding to the isolated gate driver.

FIG. 4 illustrates a circuit corresponding to the isolated gate driver 100. The input die 104 is coupled to at least four input nodes: $V_{DD}$, a high voltage signal (INhi), a low voltage signal (INlo), and ground. The output die 106 is coupled to at least four output nodes: $V_{CC}$, $V_O$, N/C, and $V_{EE}$. A magnetic assembly or transformer 108 is provided between the input and output dice to provide signal transfer and voltage isolation.

Figure 5:
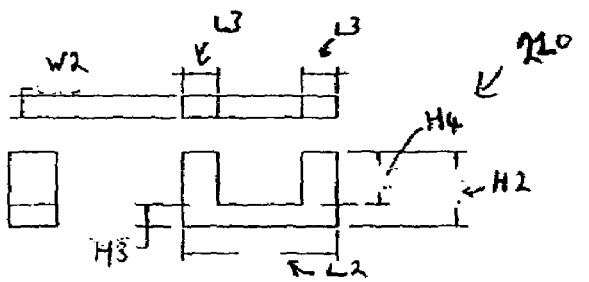
FIG. 5 illustrates the dimensions of a U-core and an I-bar according to one embodiment of the present invention.
Figure 5:
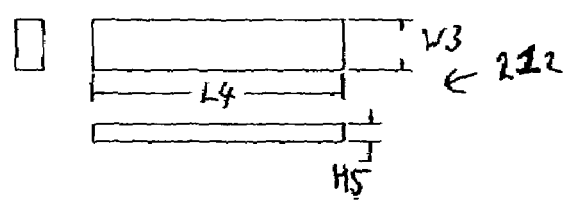

FIG. 5 illustrates the dimensions of a U-core 210 and an I-bar 212 according to one embodiment of the present invention. The U-core 210 is provided with angular-shaped posts that are configured to be inserted into the thorough holes 126 in the substrate 102. The thorough holes have the diameter of about 0.40 inch and a pitch of about 0.86 inch. Accordingly, the U-core has a length L2 of about 0.111 inch, an outer height H2 of about 0.085 inch, and an inner height H3 of about 0.025 inch. The U-core 110 is has square-shaped posts and has a height H4 of about 0.060 inch, a width W2 of about 0.025 inch, and a length of about L3 0.025 inch. The outer height of the U-core corresponds to the height of the post plus the inner height of the U-core. The I-bar 112 has a height H5 of about 0.020 inch, a length L4 of about 0.180 inch, and a width W3 of about 0.057 inch. In other embodiment, the U-core may have round posts. The round posts provides a 50% larger cross-section area than the square-shaped the posts of the U-core 210 and also provider a snugger fit.

FIGS. 6A-6D illustrate a method of manufacturing an isolated, packaged gate driver according to one embodiment of the present invention. The method relates to making a gate driver in a BGA package; however, those skilled in the art would understand that the techniques disclosed herein may be implemented to other packaging technologies, e.g., PDIP. A substrate 302 having a groove 304 and a thorough hole 306 is provided (FIG. 3A). For illustrative convenience only one hole is shown, but the substrate has two holes to receive two posts of the U-core. The substrate is of PCB having high Tg. In the present embodiment, the substrate 302 is one of many substrates that are arranged on a strip 402 (see FIG. 7) of a panel. A typical BGA panel has a plurality of strips. The strip 402 has three blocks 404. Each block has twenty-eight substrates 302 in the present embodiment. Since all of the substrates on the strip under go the same process, the manufacturing method is explained using the processes as they are performed on a single substrate.

Referring back to FIG. 6A, the substrate is provided with its bottom-side facing up, so that the groove 304 faces upward. The substrate has a plurality of dielectric layers 308, 310, and 312. The groove 304 is defined on the dielectric layer 308. A plurality of conductive layers (not shown) are provided on or between major surfaces of the dielectric layers. A first conductive layer, including component pads and winding, is defined on an active surface 314 of the dielectric layer 312. A second conductive layer, including winding and interconnects, is provided between dielectric layers 310 and 312, e.g., on the dielectric layer 310. A third conductive layer, including winding and interconnects, is provided between the dielectric layers 308 and 310. A fourth conductive layer, including solder ball pads, is provided on the dielectric layer 308 facing upward in FIG. 6A since the substrate is placed flip over in the figure. A plurality of interconnects or signal fingers 316 extend from the active surface 314 to the bottom of the substrate. The interconnects are used to connect the input and output pads to the solder balls to be bonded subsequently on the bottom of the substrate.

Adhesive is placed on the middle of the groove (see FIG. 1C), so that the ends of the I-bar is not bonded or secured to the substrate. This reduces the possibility of the I-bar from cracking when the epoxy resin is later cured, as explained before. The I-bar is placed on the substrate within the groove, and then the adhesive is cured.

Figure 6A:
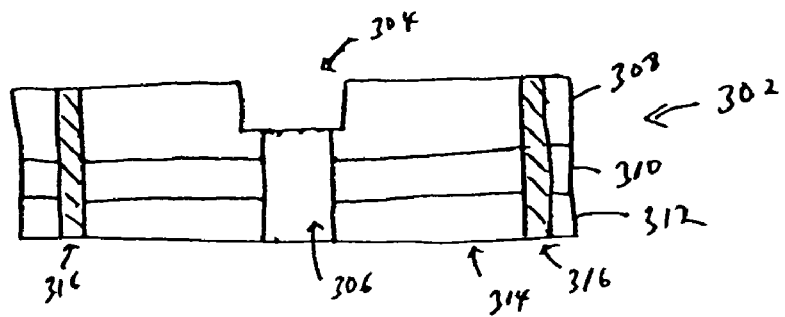
FIGS. 6A-6D illustrate a method of manufacturing an isolated, packaged gate driver according to one embodiment of the present invention.
Figure 6B:
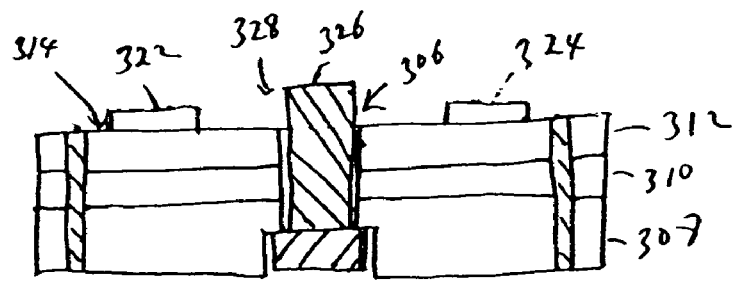
Figure 7:
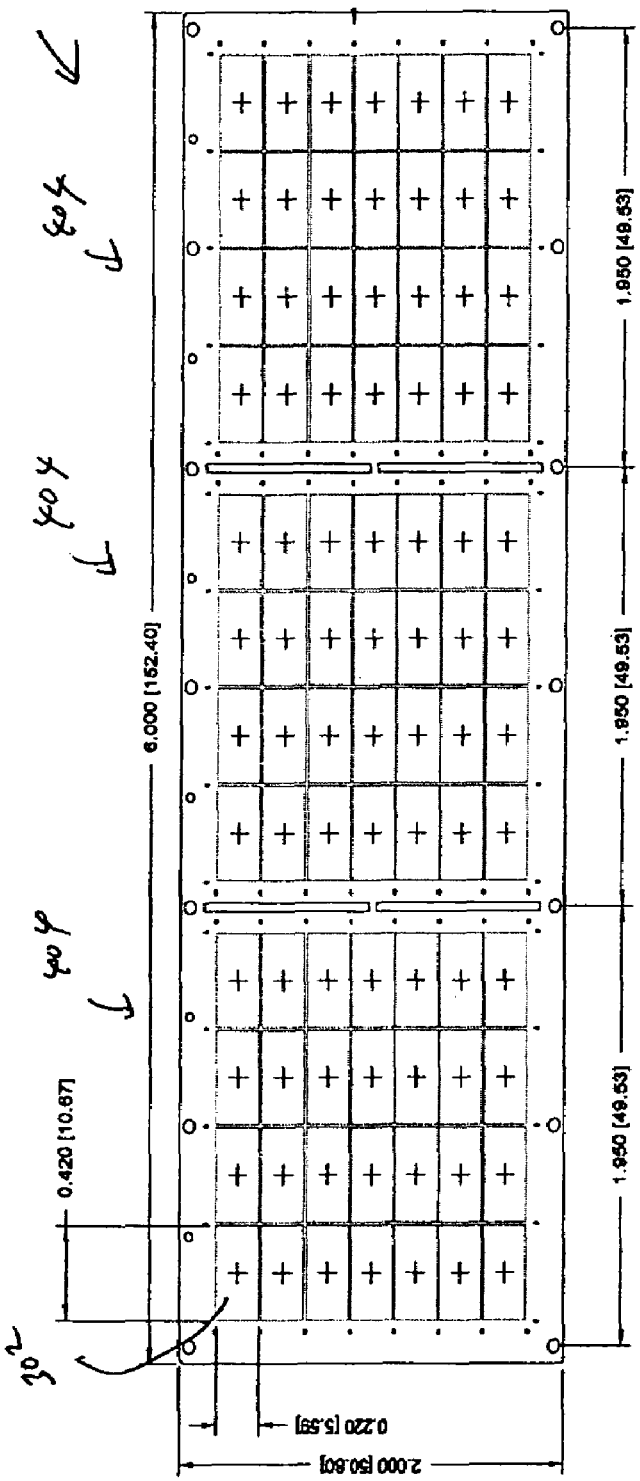
FIG. 7 illustrates a strip or portion of a panel having a plurality of BGA substrates according to one embodiment of the present invention.

Referring to FIG. 6B, the substrate is flip-over to place it right-side up after the I-bar has been bonded to the substrate. As a result, the third layer 312 and active surface 314 are now facing upward. Die-attach epoxy is placed on the input and output die pads (see FIG. 3) to bond the input and output dice 322 and 324 thereon. The input and output dice are placed on the their designated places on the active surface (or upper surface of the substrate). The die-attach epoxy is then cured.

Thereafter, a U-core 326 is inserted into the thorough hole 306 until its posts contact the I-bar provided below. The posts of the U-core may have different shapes, as explained in connection with FIG. 5. Adhesive is provided to the ends of the U-core to securely attached the U-core to its position. The adhesive is then cured. A magnetic assembly or transformer 328 is formed.

Figure 6C:
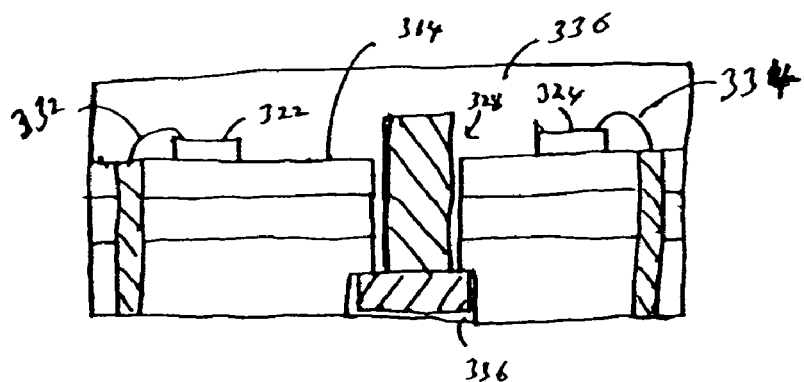
Figure 6D:
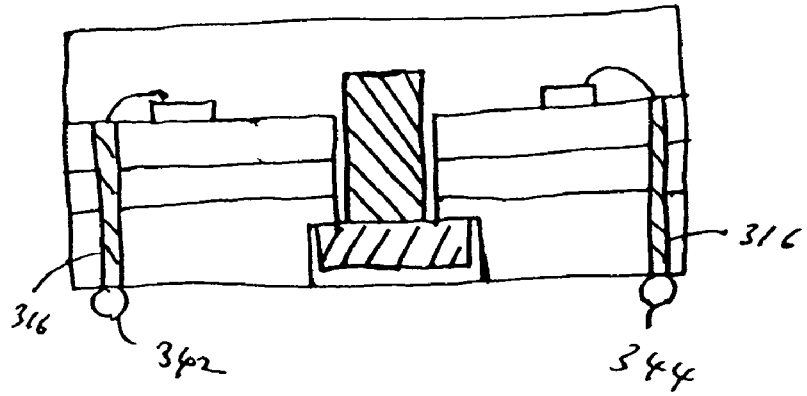

Referring to FIG. 6C, the input and output dice are connected to the signal and power pads using bonding wires 332 and 334. The wires 332 associated with the input die enable the input die to receive signals. These signals are then sent to the output die via the transformer 328. The output die uses the wires 334 to transmit the output signals to drive the power MOSFET or IGBT (not shown) to which the output die is coupled. Molding material or epoxy resin 336 is formed over the active surface 314 and within the groove. The resin is cured to harden it, so that it can serve as a protective enclosure. A plurality of balls 342 and 344 are placed on the bottom of the substrate to connect to the lower parts of the signal fingers 316. The first set of balls 342 (see FIG. 1C) are provided on one end of the substrate, and the second set of balls 344 are provided on the opposing end of the substrate, so that the first and second sets of the balls are separated by a sufficient distance for the required voltage isolation. Thereafter the substrates on the panel 402 are singulated into individual substrates or power devices.

Figure 8:
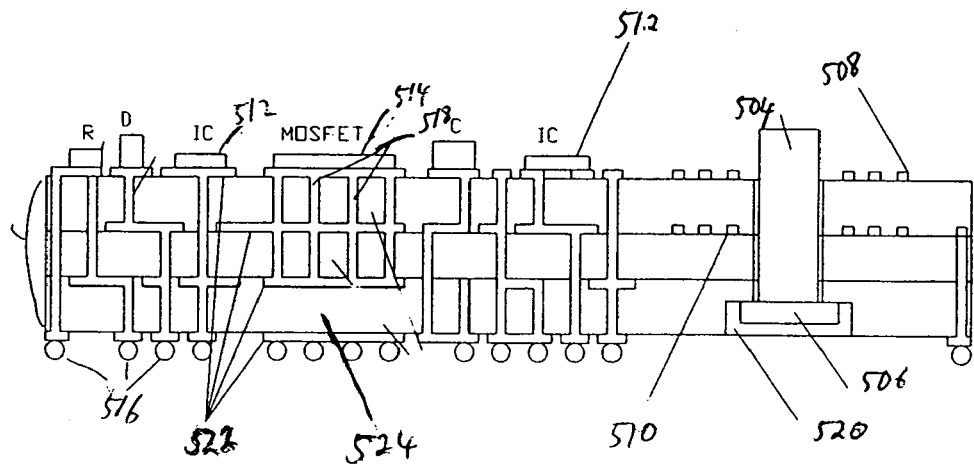
FIG. 8 illustrates an isolated, packaged power device according to one embodiment of the present invention.

FIG. 8 illustrates an isolated, packed power device 500 according to one embodiment of the present invention. The power device 500 is configured to handle increased power by providing thermal vias. The power device includes a substrate 502, a U-core 504, a I-bar 506, a primary winding 508, a secondary winding 510, a plurality of semiconductor chips 512, a power MOSFET 514, a plurality of balls 516, a plurality of thermal vias 518, a groove 520, and a plurality of conductive layers. The thermal vias are provided below and near the power MOSFET 514 to dissipate or transfer the heat generated by the MOSFET 514 to a thermal dielectric layer 524 that is also provided at the lower side of the device. The thermal dielectric layer is configure to dissipate heat while providing electrical isolation.

Figure 9A:
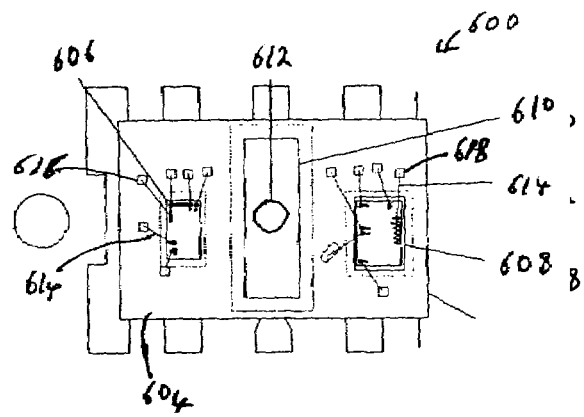
FIG. 9A illustrates a top view a of an isolated gate driver in a PDIP according to one embodiment of the present invention.

FIG. 9A illustrates a top view a of an isolated gate driver 600 in a PDIP according to one embodiment of the present invention. The gate driver 600 includes a substrate 602 and a top surface 604. An input die 606 and output die 608 are placed on the top surface and bonded. An I-bar 610 is placed on the top surface and bonded thereon rather than on the bottom of the substrate, unlike in the gate driver 100, 300. Adhesive 612 is used to bond only the middle of the I-bar to the substrate. The dice 606 and 608 are wired bonded 614 to the input and output pads 616 and 618.

Figure 9B:
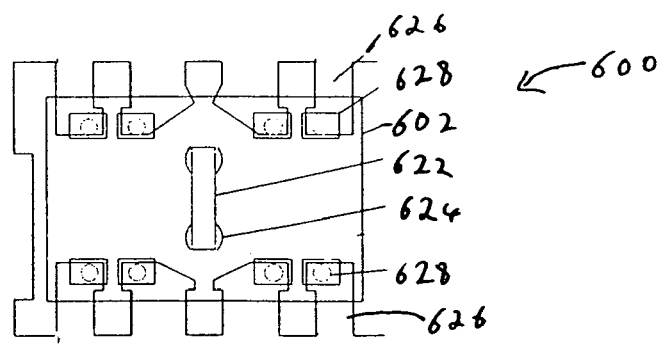
FIG. 9B illustrates a bottom view of the gate driver of FIG. 5A.

FIG. 9B illustrates a bottom view of the gate driver 600 of FIG. 5A. The posts of a U-core 622 are inserted into thorough holes 624. A plurality of leads 625 contact a plurality of bonding pads 628 to electrically connect the leads to the dice.

The present invention has been described in terms of specific embodiments. As will be understood by those skilled in the art, the embodiments described above may be modified or altered without departing from the scope of the present invention. For example, the input windings may be defined on the third layer or active surface, and the output winding may be defined on the second layer. The scope of the present invention should be interpreted using appended claims.

What is claimed is:

1. A packaged device, comprising:
   a substrate having first and second dielectric layers, the first dielectric layer having a first winding defined thereon, the second dielectric layer having a second winding defined thereon;
   a magnetic assembly provided in the substrate;
   an input die provided on the first dielectric layer to receive a first signal and transmit a second signal to the magnetic assembly;
   an output die provided on the first dielectric layer to receive the second signal via the magnetic assembly and output a third signal to an external node; and
   a package material provided over the magnetic assembly, the input die, and the output die to protect the magnetic assembly, the input die, and the output die from being damaged.

2. The packaged device of claim 1, wherein the device is a gate driver.

3. The packaged device of claim 1, wherein the magnetic assembly is a transformer and facilitates in isolating the input die from the output die.

4. The packaged device of claim 1, wherein the magnetic assembly includes a U-core and an I-bar.

5. The packaged device of claim 4, wherein the I-bar is bonded to the substrate only on a middle part of the I-bar.

6. The packaged device of claim 4, wherein the substrate includes a third dielectric layer having a groove to receive the I-bar, wherein the third dielectric layer is a bottom layer and the first dielectric layer is a top layer.

7. The packaged device of claim 6, further comprising:
a plurality of first balls associated with the input die and secured to the third dielectric layer of the substrate; and
a plurality of second balls associated with the output die and secured to the third dielectric layer of the substrate, wherein the first balls and the second balls are placed on the opposite ends of the substrate.

8. The packaged device of claim 7, wherein the first balls are arranged in a single row.

9. The packaged device of claim 7, wherein the first balls are arranged in at least two rows.

10. The packaged device of claim 4, wherein the U-core includes first and second posts that are inserted into first and second holes on the substrate, the first post being associated with the first winding, the second post being associated with the second winding.

11. The packaged device of claim 10, wherein the first and second posts have an angular-shape or round shape.

12. The packaged device of claim 1, wherein the device is configured to provide an isolation capacity of at least 3700 volts.

13. The packaged device of claim 12, wherein the device has a height of no more than 0.15 inch, a width of no more than 0.3 inch, and a length of no more than 0.5 inch.

14. The power device of claim 12, wherein the device has a height of about 0.11 inch, a width of about 0.22 inch, and a length about 0.42 inch.

15. The power device of claim 1, wherein the device has a height of no more than 0.3 inch, a width of no more than 0.5 inch, and a length of no more than 1 inch.

16. The power device of claim 1, wherein the device is a ball-grid-array package type or a plastic-dual-in-line-package type.

17. A packaged device, comprising:
a planar magnetic substrate having first and second dielectric layers, the first dielectric layer having a first winding defined thereon, the second dielectric layer having a second winding defined thereon;
at least one magnetic component provided in the substrate; and
a package material provided at least partly around the substrate and the magnetic component to protect the substrate and magnetic component,
wherein the magnetic component is integrated into the packaged device using a semiconductor package technology.

18. The packaged device of claim 17, wherein the magnetic component is an inductor or transformer.

19. The packaged device of claim 17, further comprising:
at least one electronic component provided on the first dielectric layer, wherein the semiconductor package technology is one selected from a BGA assembly process, PDIP assembly process, and SOIC assembly process.

20. The packaged device of claim 17, further comprising:
at least one electrical component provided on the first dielectric layer.

21. The packaged device of claim of claim 20, wherein the electrical component is a resistor or capacitor.

22. The packaged device of claim 17, wherein the substrate and the magnetic component are configure to accommodate an automatic pack and place process.

* * * * *